(12) United States Patent
Chen et al.

(10) Patent No.: US 9,629,459 B2
(45) Date of Patent: Apr. 25, 2017

(54) SLIDE RAIL ASSEMBLY (71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Zong-Sian Wong, Kaohsiung (TW); Chun-Chiang Wang, Kaohsiung (TW)

(73) Assignees: King Slide Works Co., Ltd., Kaohsiung (TW); King Slide Tehcnology Co., Ltd., Kaohsiung (TW)

( * ) Notice: Subject to any disclaimer, the term of this patent is extended or adjusted under 35 U.S.C. 154(b) by 0 days.

(21) Appl. No.: 14/813,317

(22) Filed: Jul. 30, 2015

(65) Prior Publication Data
US 2016/0262538 A1 Sep. 15, 2016

(30) Foreign Application Priority Data

Mar. 12, 2015 (TW) .............................. 104108020 A (51) Int. Cl.
A47B 88/04 (2006.01)
H05K 7/14 (2006.01)
A47B 88/08 (2006.01)
A47B 88/16 (2006.01)
A47B 96/02 (2006.01)

(52) U.S. Cl.
CPC .............. *A47B 88/04* (2013.01); *A47B 88/08* (2013.01); *A47B 88/16* (2013.01); *A47B 96/025* (2013.01); *H05K 7/1489* (2013.01)

(58) Field of Classification Search
CPC ......... A47B 88/04; A47B 88/08; A47B 88/16; A47B 96/025; A47B 2088/0444; A47B 2210/0018; A47B 2210/0035; A47B 2210/0059; A47B 2210/005; F16C 29/005; F16C 29/046; F16C 29/048; H05K 7/1489
USPC .................................................... 211/126.15
See application file for complete search history.

(56) References Cited

U.S. PATENT DOCUMENTS

| | | | |
|---|---|---|---|
| 6,367,899 B1 | 4/2002 | Hwang et al. | |
| 6,375,290 B1 | 4/2002 | Lin et al. | |
| 6,412,891 B1 | 7/2002 | Liang et al. | |
| 6,705,689 B2 | 3/2004 | Chen et al. | |
| 6,851,774 B2 | 2/2005 | Chen et al. | |
| 7,677,679 B2 | 3/2010 | Hsiung et al. | |
| 7,857,403 B2 | 12/2010 | Chen et al. | |
| 8,240,789 B2 | 8/2012 | Chen et al. | |
| 8,500,223 B2 * | 8/2013 | Lacarra | A47B 88/10 312/333 |

(Continued)

Primary Examiner — Korie H Chan
(74) Attorney, Agent, or Firm — Rosenberg, Klein & Lee (57) ABSTRACT A slide rail assembly includes a first rail, a second rail, an engaging member, and an operation member. The first rail includes a blocking feature. The second rail is movably connected to the first rail and can be longitudinally displaced from a retracted position to a first extended position and a second extended position relative to the first rail. The engaging member is attached to the second rail. The operation member is mounted to at least one of the first rail and the second rail. The operation member is used to operate the engaging member so that the engaging member is blocked by the blocking feature of the first rail and thus keeps the second rail at the first extended position.

10 Claims, 11 Drawing Sheets (56) References Cited

U.S. PATENT DOCUMENTS

| | | | |
|---|---|---|---|
| 8,528,999 B2 | 9/2013 | Chen et al. | |
| 2001/0040142 A1* | 11/2001 | Haney | A47B 88/044 211/183 |
| 2003/0205539 A1* | 11/2003 | Lauchner | H05K 7/1489 211/26 |
| 2006/0244349 A1* | 11/2006 | Chen | A47B 88/10 312/334.47 |
| 2007/0164644 A1* | 7/2007 | Hwang | A47B 88/08 312/333 |
| 2008/0197758 A1* | 8/2008 | Mushan | A47B 88/10 312/334.1 |
| 2010/0259146 A1* | 10/2010 | Chen | A47B 88/10 312/319.1 |
| 2011/0135224 A1* | 6/2011 | Chen | F16C 29/04 384/26 |

* cited by examiner

SLIDE RAIL ASSEMBLY

FIELD OF THE INVENTION

The present invention relates to a slide rail assembly and more particularly to a slide rail assembly in which one slide rail can be operated relative to another slide rail and stay at a predetermined position so as to change the overall extended length of the slide rail assembly.

BACKGROUND OF THE INVENTION

Generally, a slide rail assembly includes at least two slide rails which can be displaced relative to each other to bring the slide rail assembly into an extended or retracted state. For example, U.S. Pat. No. 7,677,679 B2 discloses a slide rail assembly including a first rail (10), a second rail (20), and a third rail (30). The first rail (10) includes a stop (14) and a block (16). The second rail (20) has a stop piece (28) and a slot (26) for receiving a retention pin (40). When the three rails are in a completely extended state, the retention pin (40) and the stop piece (28) are blocked by the stop (14) and the block (16) of the first rail (10) respectively, thus limiting displacement of the second rail (20) relative to the first rail (10). The disclosure of this US patent is incorporated into the present specification by reference.

The slide rail assembly disclosed in the foregoing US patent is so configured that one of the rails can be kept at a completely extended position relative to another rail when the slide rail assembly is in the completely extended state. The former rail, however, cannot be retained relative to the latter rail at a position other than the completely extended position.

SUMMARY OF THE INVENTION

The present invention relates to a slide rail assembly in which one slide rail can be displaced relative to another rail from a retracted position to a first extended position and a second extended position and be so operated as to stay at the first extended position.

According to one aspect of the present invention, a slide rail assembly includes a first rail, a second rail, an engaging member, and an operation member. The first rail includes a blocking feature. The second rail is movably connected to the first rail and can be longitudinally displaced relative to the first rail from a retracted position to a first extended position and a second extended position. The engaging member is attached to the second rail. The operation member is mounted to one of the first rail and the second rail. The operation member can be used to operate the engaging member so that the engaging member is blocked by the blocking feature of the first rail and thus retains the second rail at the first extended position.

According to another aspect of the present invention, a slide rail assembly includes a first rail, a second rail, an engaging member, and an operation member. The first rail includes a blocking feature. The second rail is longitudinally movably connected to the first rail and can be displaced relative to the first rail from a retracted position to a first extended position and a second extended position. The engaging member is attached to the second rail. The operation member is mounted to the second rail and can be used to operate the engaging member. Once the second rail is displaced relative to the first rail to the first extended position, the operation member can be manually operated so that a portion of the engaging member is blocked by the blocking feature of the first rail and thus retains the second rail at the first extended position relative to the first rail.

According to yet another aspect of the present invention, a slide rail assembly adapted for mounting an object to a rack is provided, wherein the rack includes a first post and a second post. The slide rail assembly includes a first rail, a second rail, a third rail, an engaging member, and an operation member. The first rail has two portions respectively connected with a first bracket and a second bracket. The first bracket and the second bracket are mounted to the first post and the second post respectively. The first rail includes a blocking feature. The second rail is longitudinally movably connected to the first rail and can be displaced relative to the first rail from a retracted position to a first extended position and a second extended position. The third rail is longitudinally movably connected to the second rail and is mounted with the object. The engaging member is attached to the second rail. The operation member is mounted to the second rail and can be used to operate the engaging member so that the engaging member is blocked by the blocking feature of the first rail and thus retains the second rail at the first extended position.

In some embodiments of any of the foregoing aspects, the first rail has a front portion, and the blocking feature is adjacent to the front portion of the first rail.

In some embodiments of any of the foregoing aspects, the first rail further includes an upper wall, a lower wall, and a sidewall connected between the upper wall and the lower wall; the sidewall has the blocking feature; the blocking feature includes an opening; and the opening has a periphery provided with at least one blocking wall.

In some embodiments of any of the foregoing aspects, the second rail includes an upper wall, a lower wall, and a sidewall connected between the upper wall and the lower wall; and the engaging member is attached to the sidewall of the second rail.

In some embodiments of any of the foregoing aspects, the engaging member includes an abutment portion and an engaging portion, and the operation member is movably mounted to the second rail and can be used to push the abutment portion so that the engaging portion of the engaging member is blocked by the blocking feature of the first rail. In addition, the slide rail assembly includes a connecting member for movably connecting the operation member to the second rail.

In some embodiments of any of the foregoing aspects, the engaging member includes an abutment portion and an engaging portion, at least one of the second rail and the operation member further includes a longitudinal groove, and a connecting member is passed through the longitudinal groove to connect the operation member to the second rail. The operation member can be operated in order to be displaced relative to the second rail according to the longitudinal groove, thereby pushing the abutment portion and resulting in blockage of the engaging portion of the engaging member by the blocking feature of the first rail.

In some embodiments of any of the foregoing aspects, the slide rail assembly further includes a third rail longitudinally movably connected to the second rail.

One of the advantageous features of applying the present invention is that one of the slide rails of the slide rail assembly can be operated relative to another slide rail and be kept at a predetermined extended position.

DETAILED DESCRIPTION OF THE INVENTION

Figure 1:
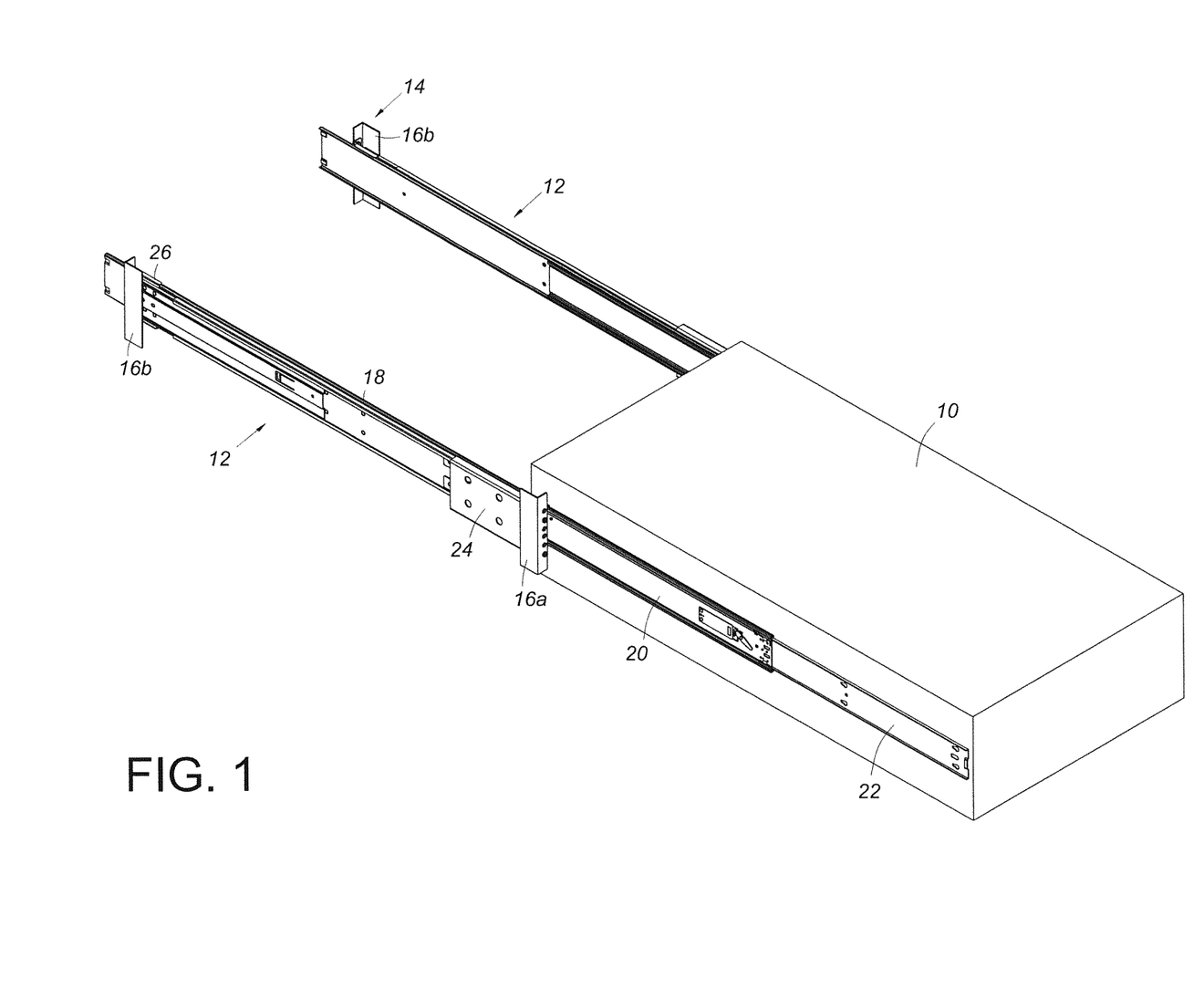
FIG. 1 is a perspective view showing how the slide rail assembly in an embodiment of the present invention is used in pairs to mount an object to a rack, wherein the slide rail assemblies are in an extended state.

Referring to FIG. 1, an object 10 is mounted to a rack 14 by a pair of slide rail assemblies 12. The object 10 can be the chassis of a piece of electronic equipment or any other object to be mounted to the rack 14; the present invention imposes no limitations in this regard. The rack 14 includes a pair of first posts 16a and a pair of second posts 16b. (Please note that only one first post 16a is shown in FIG. 1 due to limitation of the viewing angle.) More specifically, each slide rail assembly 12 includes a first rail 18 and a second rail 20, preferably with the addition of a third rail 22. Each first rail 18 has two portions respectively connected with a first bracket 24 and a second bracket 26 and is mounted between the corresponding first post 16a and second post 16b by the first bracket 24 and the second bracket 26. The third rails 22 are configured to be mounted with the object 10.

Figure 2:
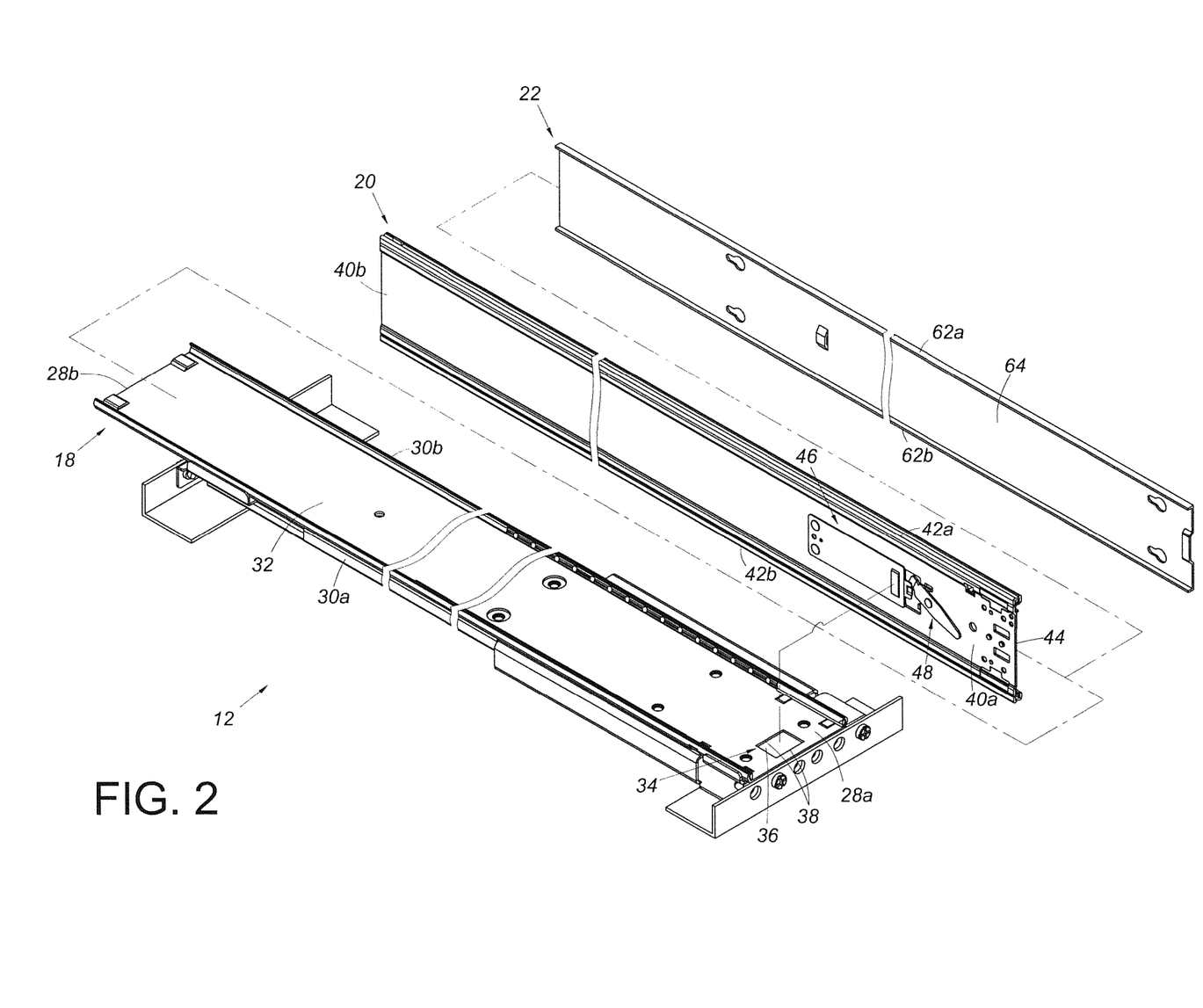
FIG. 2 is an exploded perspective view of one of the slide rail assemblies in FIG. 1.

As shown in FIG. 2, the first rail 18 has a front portion 28a and a rear portion 28b opposite the front portion 28a. More specifically, the first rail 18 includes an upper wall 30a, a lower wall 30b, and a sidewall 32 connected between the upper wall 30a and the lower wall 30b. The first rail 18 further includes a blocking feature 34. For instance, the blocking feature 34 is located at the sidewall 32 and is adjacent to the front portion 28a of the first rail 18. The location of the blocking feature 34, however, is not limited to the foregoing in practice. In this embodiment, the blocking feature 34 includes an opening 36 having a periphery provided with at least one blocking wall 38.

With continued reference to FIG. 2, the second rail 20 is longitudinally movably connected to the first rail 18. The second rail 20 has a front portion 40a and a rear portion 40b opposite the front portion 40a. More specifically, the second rail 20 includes an upper wall 42a, a lower wall 42b, and a sidewall 44 connected between the upper wall 42a and the lower wall 42b. The upper wall 42a and the lower wall 42b of the second rail 20 correspond to the upper wall 30a and the lower wall 30b of the first rail 18 respectively.

Figure 3:
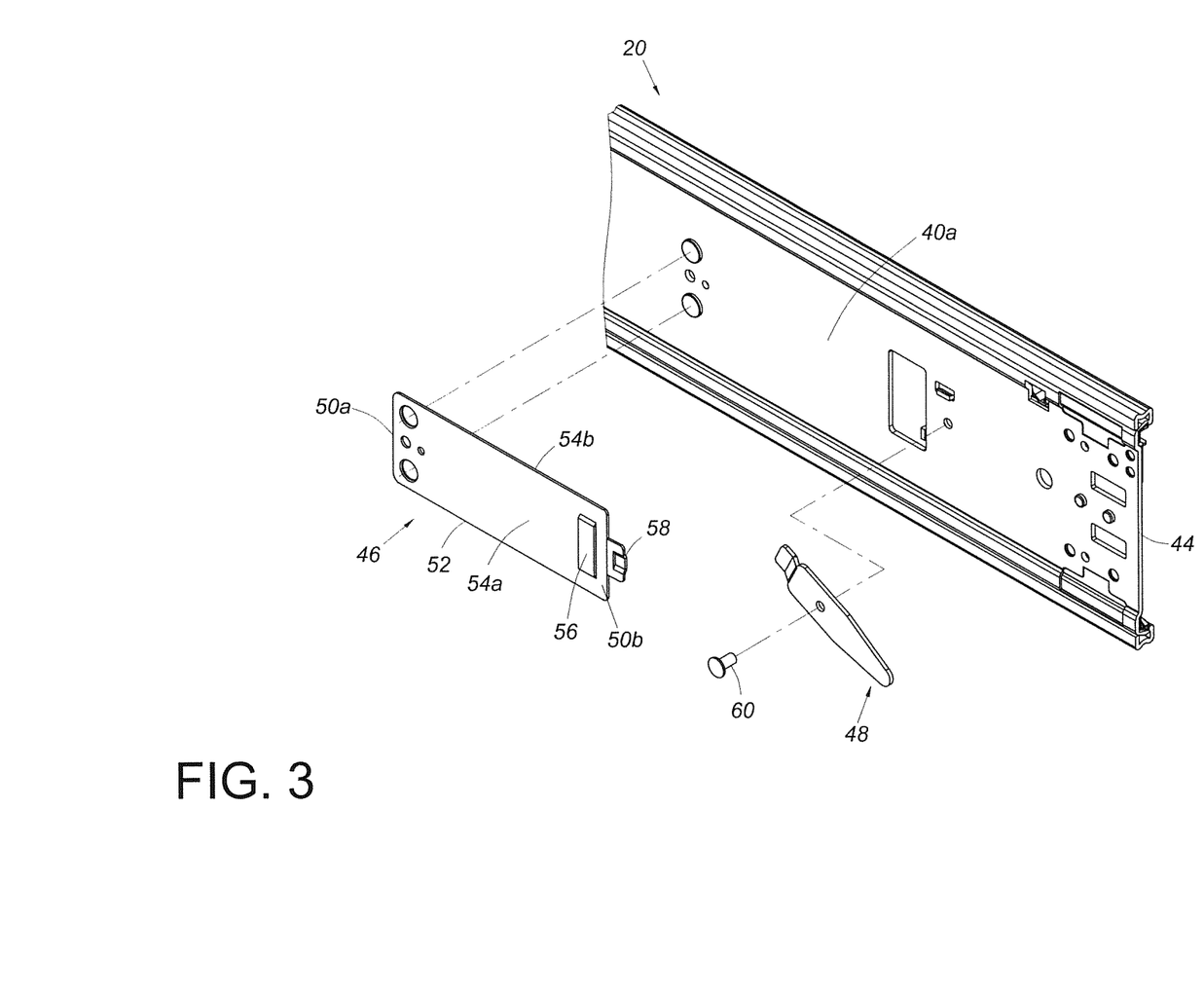
FIG. 3 is a partial exploded perspective view of the slide rail assembly in FIG. 2, showing in particular the engaging member and the operation member, both provided on the second rail.

As shown in FIG. 2 and FIG. 3, the slide rail assembly 12 includes an engaging member 46 and an operation member 48 adjacent to the engaging member 46. The engaging member 46 is located between the front portion 40a and the rear portion 40b of the second rail 20 and can be attached to one side of the sidewall 44 of the second rail 20. Preferably, the engaging member 46 is adjacent to the front portion 40a of the second rail 20. The engaging member 46 can be additionally provided with an elastic element (e.g., a spring) in order to produce an elastic force. Alternatively, the engaging member 46 can be an elastic plate, as demonstrated in this embodiment, but is not necessarily so. More specifically, the engaging member 46 includes a first portion 50a, which can be fixedly connected to the sidewall 44 of the second rail 20; a second portion 50b distant from the first portion 50a; and a main body 52 connected between the first portion 50a and the second portion 50b. The main body 52 has a first surface 54a and a second surface 54b. The first surface 54a and the second surface 54b of the main body 52 face the first rail 18 and the second rail 20 respectively. In this embodiment, the engaging member 46 further includes an engaging portion 56 and an abutment portion 58. The engaging portion 56 is located at the first surface 54a of the main body 52 and is adjacent to the second portion 50b. The abutment portion 58 is adjacent to the second portion 50*b* and has a surface on the same side as the second surface 54*b* of the main body 52.

The operation member 48 can be used to operate the engaging member 46 and is mounted to at least one of the first rail 18 and the second rail 20. In this embodiment, the operation member 48 is movably mounted to the second rail 20 by way of example. For instance, the operation member 48 can be movably connected (e.g., pivotally connected) to the sidewall 44 of the second rail 20 by a connecting member 60 in order to be operated and thus pivotally drive the engaging member 46 into displacement.

Referring back to FIG. 2, the third rail 22 is longitudinally movably connected to the second rail 20 and is located on the side of the sidewall 44 of the second rail 20 that is different from the side where the engaging member 46 and the operation member 48 are provided. More specifically, the third rail 22 includes an upper wall 62*a*, a lower wall 62*b*, and a sidewall 64 connected between the upper wall 62*a* and the lower wall 62*b*. The upper wall 62*a* and the lower wall 62*b* of the third rail 22 correspond to the upper wall 42*a* and the lower wall 42*b* of the second rail 20 respectively.

Figure 4:
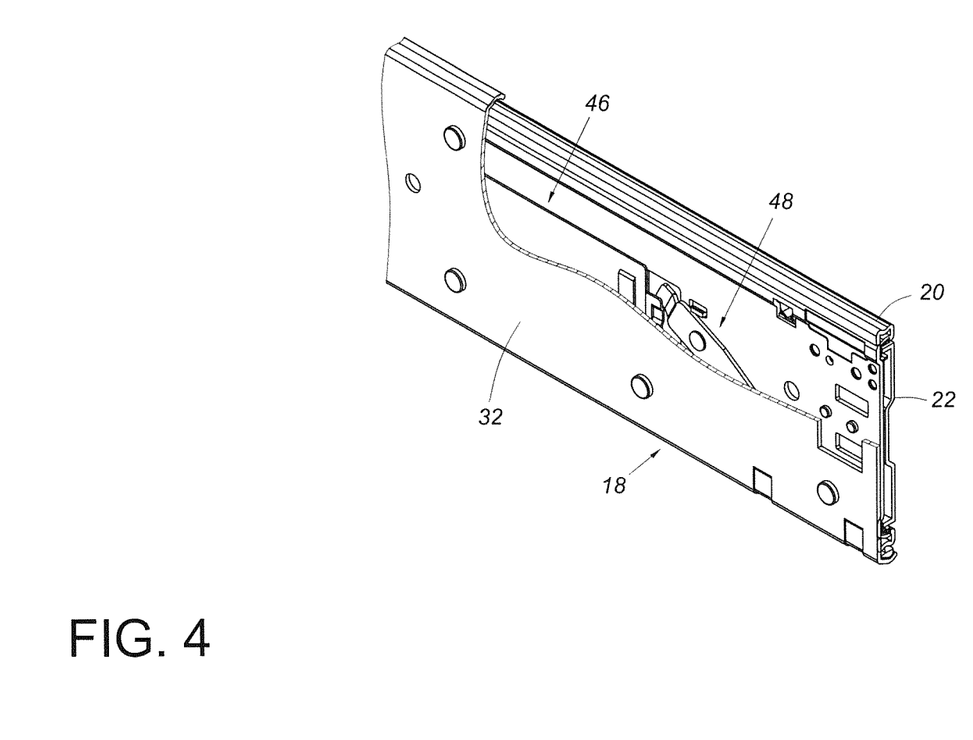
FIG. 4 is a partial assembled perspective of the slide rail assembly in FIG. 2, showing in particular the second rail and the third rail in a retracted state relative to the first rail.

As shown in FIG. 4, the second rail 20 and the third rail 22 can be brought to a retracted position relative to the first rail 18, and at this position, both the engaging member 46 and the operation member 48 correspond to the sidewall 32 of the first rail 18.

Figures 5, 5A:
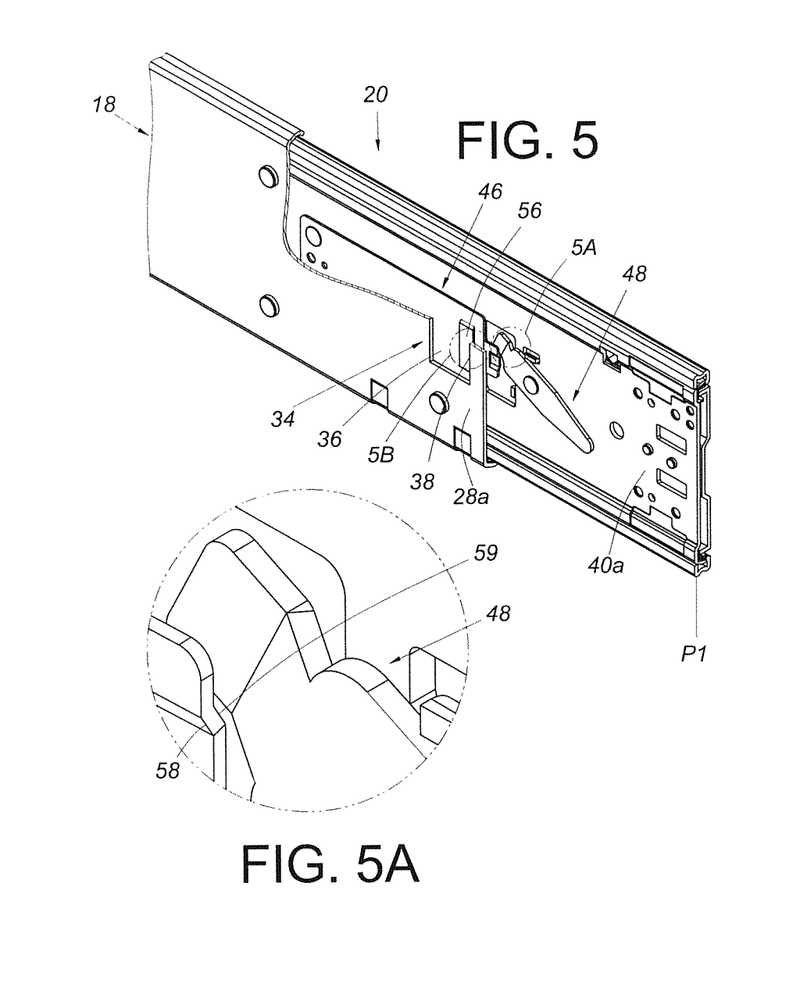
FIG. 5 is another partial assembled perspective view of the slide rail assembly in FIG. 2, showing in particular the second rail at a first extended position relative to the first rail, wherein the engaging portion of the engaging member has yet to be blocked by the blocking feature of the first rail.
FIG. 5A is an enlarged view of the circled area 5A in FIG. 5, showing that a portion of the operation member can be brought adjacent to the abutment portion of the engaging member.
Figure 5B:
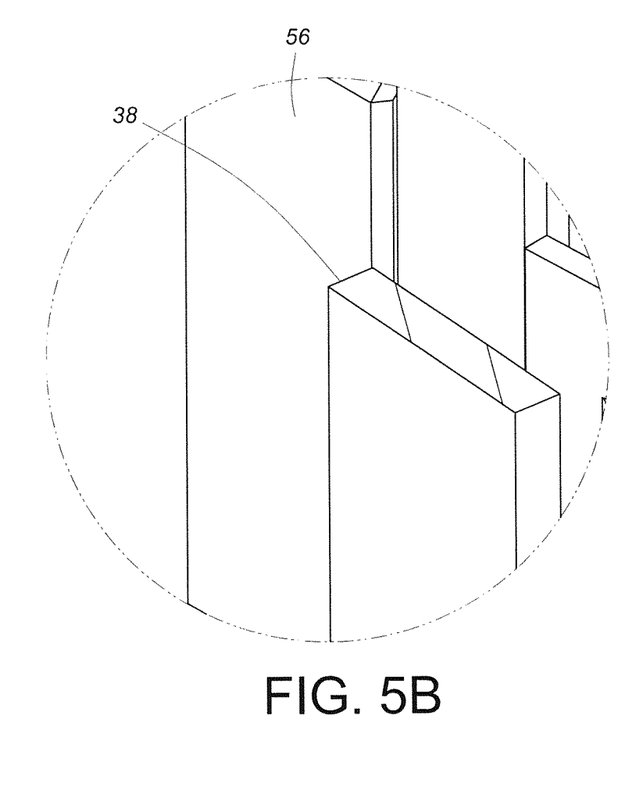
FIG. 5B is an enlarged view of the circled area 5B in FIG. 5, showing that the engaging portion of the engaging member has yet to be blocked by the blocking wall of the first rail.

Referring to FIG. 5, FIG. 5A, and FIG. 5B, once the second rail 20 is displaced relative to the first rail 18 from the retracted position to a first extended position P1, the front portion 40*a* of the second rail 20 extends beyond the front portion 28*a* of the first rail 18 by a predetermined distance. The engaging member 46 in this state is in its initial state and is not blocked by the blocking feature 34 of the first rail 18. More specifically, when the second rail 20 is at the first extended position P1, the engaging portion 56 of the engaging member 46 corresponds in position to the opening 36 of the blocking feature 34 of the first rail 18, and the engaging portion 56 is not blocked by the at least one blocking wall 38 of the first rail 18. On the other hand, a portion of the operation member 48 is adjacent to the abutment portion 58 of the engaging member 46, and the abutment portion 58 has an inclined guide surface 59 corresponding to that portion of the operation member 48. It is worth mentioning that, while the engaging member 46 in this embodiment includes the abutment portion 58 (which has the inclined guide surface 59), it is feasible for the operation member 48 in another embodiment (not shown) to include the abutment portion instead. In that case, the abutment portion of the operation member 48 will drive the engaging member 46 into displacement when the operation member 48 is operated and thereby pivoted. The present invention imposes no limitations on the location of the abutment portion.

Figure 6:
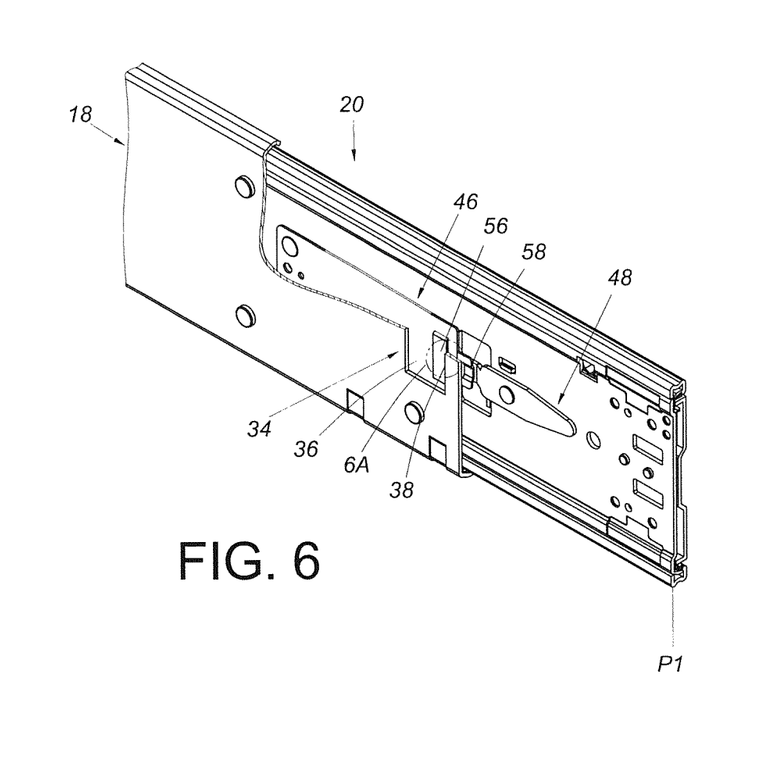
FIG. 6 is a perspective view in which the operation member of the slide rail assembly in FIG. 2 is operated and hence moved to a position where the engaging portion of the engaging member is blocked by the blocking feature of the first rail.
Figure 6A:
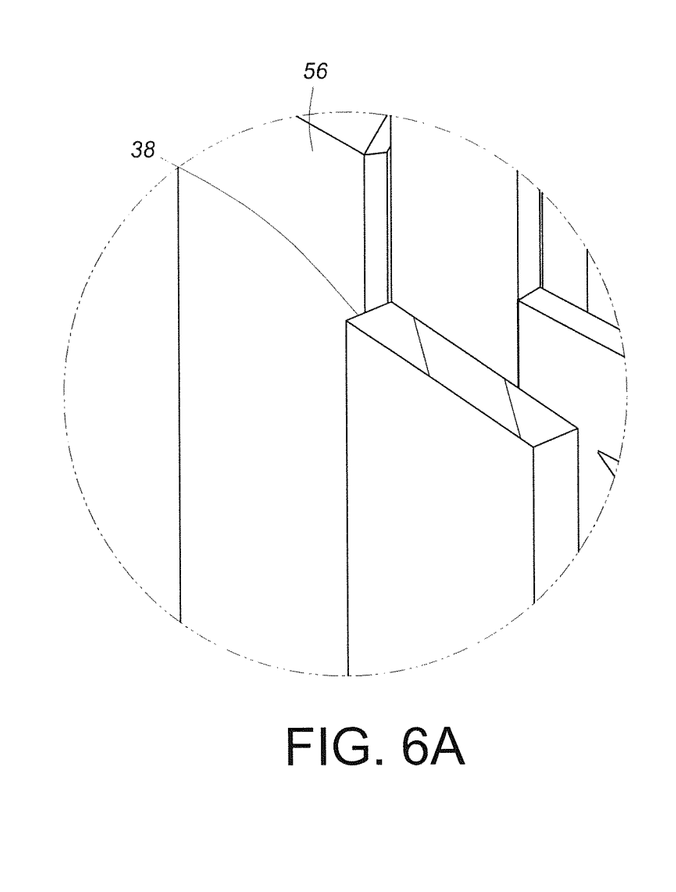
FIG. 6A is an enlarged view of the circled area 6A in FIG. 6, showing how the engaging portion of the engaging member is blocked by the blocking wall of the first rail.

As shown in FIG. 6 and FIG. 6A, when it is desired to limit the position of the second rail 20 at the first extended position P1, the operator operates the operation member 48 manually so that the operation member 48 pushes the inclined guide surface 59 of the abutment portion 58 of the engaging member 46 and thereby displaces the abutment portion 58 toward the first rail 18. As a result, the engaging portion 56 of the engaging member 46 enters the opening 36 of the blocking feature 34 of the first rail 18 and is blocked by the blocking feature 34 of the first rail 18. The second rail 20 in this state cannot be further pulled out relative to the first rail 18 from the first extended position P1. More specifically, when the engaging member 46 is displaced in response to the operation of the operation member 48, the engaging portion 56 of the engaging member 46 enters the opening 36 of the blocking feature 34 of the first rail 18 and is blocked by the at least one blocking wall 38 to retain the second rail 20 at the first extended position P1 relative to the first rail 18. It is worth mentioning that, when the operation member 48 pushes the abutment portion 58 of the engaging member 46, the engaging member 46 provides an elastic force that keeps the engaging member 46 being pushed by the operation member 48. The operator can operate the operation member 48 again to bring the engaging member 46 back to its initial state (see FIG. 5). In other words, the engaging portion 56 of the engaging member 46 can be released from the blocking wall 38 of the first rail 18, allowing the second rail 20 to displace longitudinally relative to the first rail 18 again.

Figure 7A:
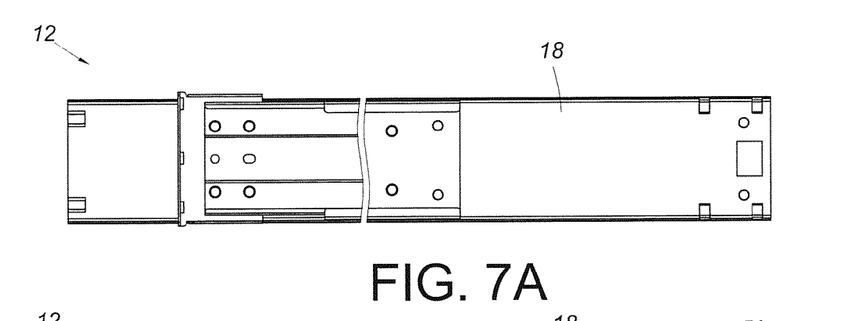
FIG. 7A is a plan view in which the slide rail assembly in FIG. 2 is in a retracted state.
Figure 7B:
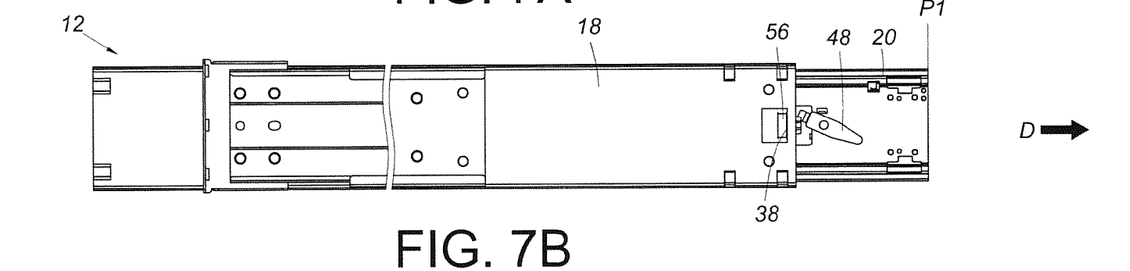
FIG. 7B is a plan view in which the second rail of the slide rail assembly in FIG. 7A is displaced relative to the first rail to a first extended position.
Figure 7C:
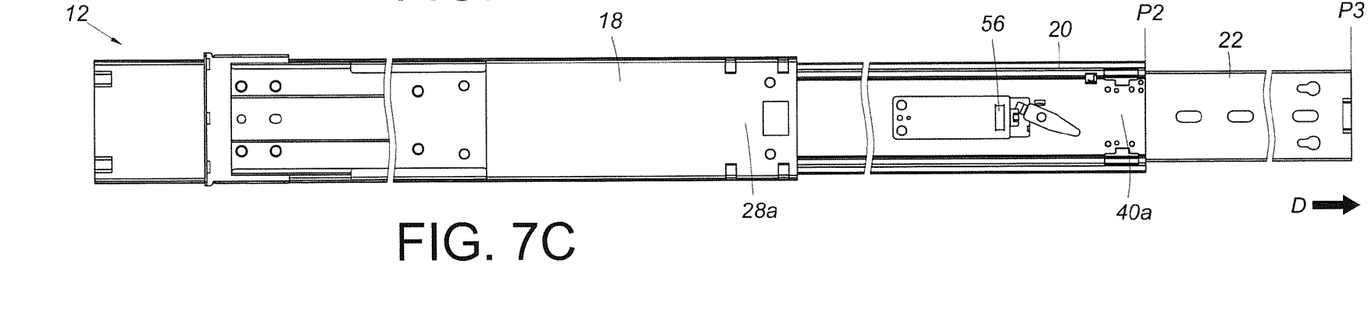
FIG. 7C is a plan view in which the engaging portion of the engaging member of the slide rail assembly in FIG. 7B has moved past the blocking feature of the first rail, allowing the second rail to be displaced to a second extended position and the third rail to be displaced relative to the second rail to a third extended position.

Referring to FIG. 7A, FIG. 7B, and FIG. 7C, the second rail 20 and the third rail 22 can be pulled out relative to the first rail 18 in an extension direction D from the retracted state and thus be longitudinally displaced relative to the first rail 18 to an extended state. Once the second rail 20 is displaced relative to the first rail 18 to the first extended position P1 (see FIG. 7B), the operator may choose not to operate the operation member 48 and hence allow the engaging portion 56 of the engaging member 46 to be moved past the blocking wall 38 of the first rail 18. In that case, the second rail 20 can be further displaced relative to the first rail 18 in the extension direction D until a second extended position P2 (see FIG. 7C) relative to the first rail 18 (e.g., a position at which the second rail 20 is fully extended) is reached. When the second rail 20 is at the second extended position P2, the front portion 40*a* of the second rail 20 extends beyond the front portion 28*a* of the first rail 18 by a greater distance than when the second rail 20 is at the first extended position P1. On the other hand, the third rail 22 can be displaced relative to the second rail 20 to a third extended position P3 to bring the slide rail assembly 12 into a further extended state. According to the above, the second rail 20 can be allowed to displace relative to the first rail 18 between the retracted position and the second extended position P2 and be temporarily retained at the first extended position P1 relative to the first rail 18 (i.e., prevented from being further pulled out relative to the first rail 18) to facilitate maintenance of the object 10 or of the slide rail assembly 12 itself in a limited space.

Figure 8A:
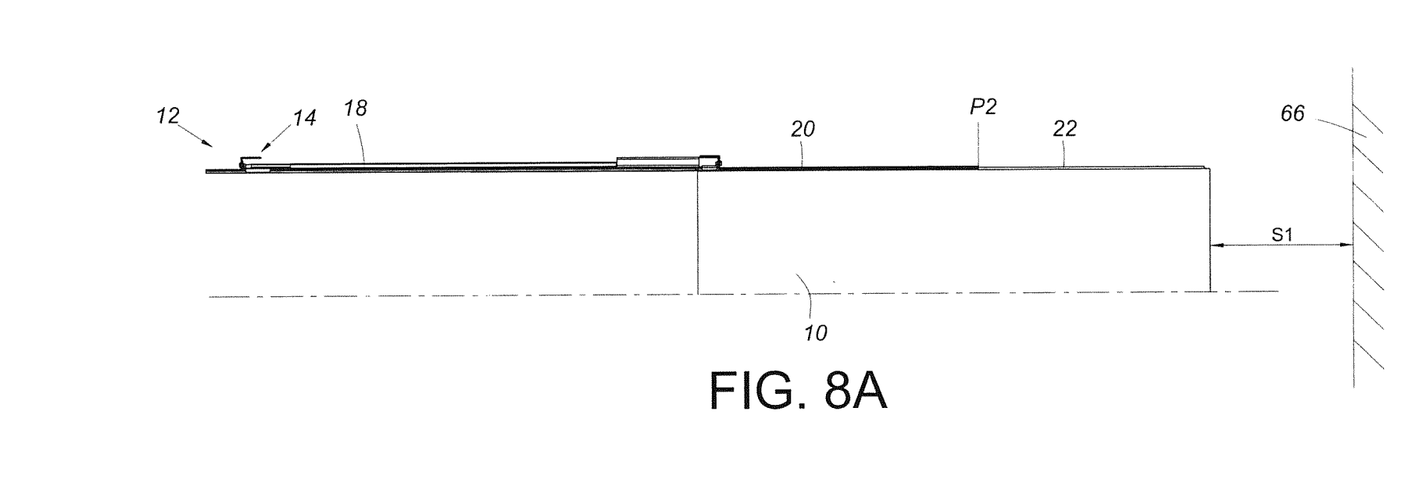
FIG. 8A schematically shows how an object is mounted to a rack via the slide rail assembly in FIG. 2 and is used in a certain environment.
Figure 8B:
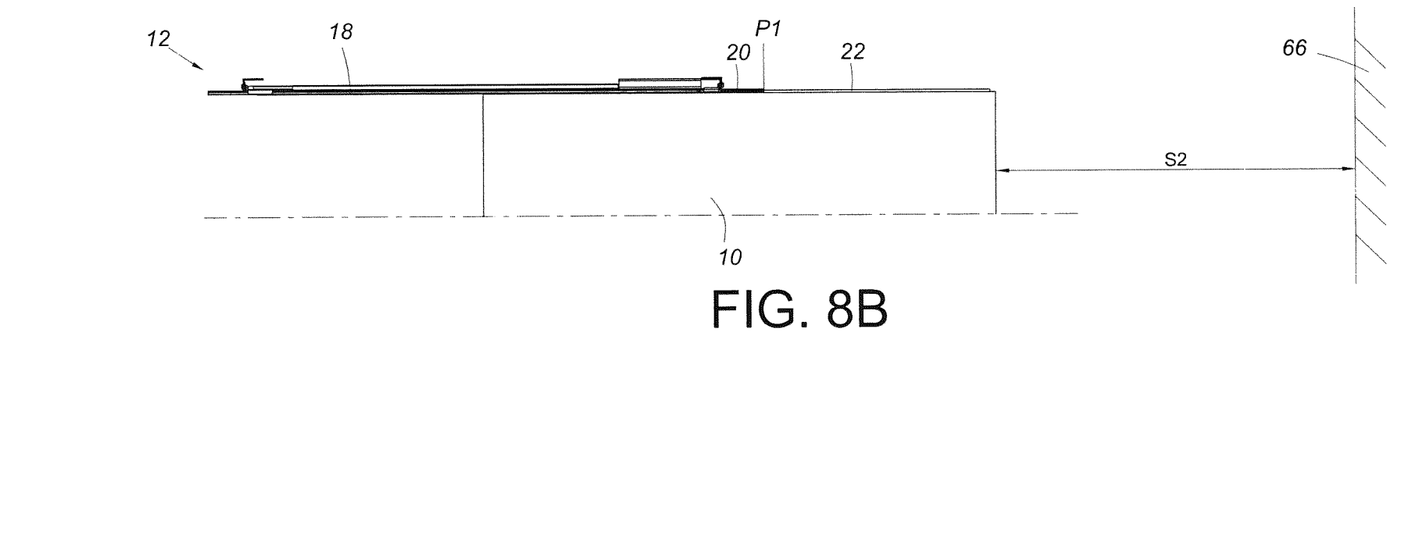
FIG. 8B is another schematic drawing showing how the object in FIG. 8A is used in the environment.

Referring to FIG. 8A and FIG. 8B, the object 10 is mounted on the rack 14 via the slide rail assembly 12 in order to be used in a certain environment. When the second rail 20 is at the second extended position P2 relative to the first rail 18, and the third rail 22, which is mounted with the object 10, is pulled out relative to the second rail 20, there may be a first space S1 between the third rail 22 (or the object 10) and an obstacle 66 (e.g., a wall, door, or other obstacle in the environment). If the first space S1 is too small, it will be impossible for an operator to perform maintenance work on the object 10 or the slide rail assembly 12. However, by operating the operation member 48 (as stated above with reference to FIG. 6), the operator can keep the second rail 20 at the first extended position P1 relative to the first rail 18 to shorten the overall extended length of the slide rail assembly 12 so that a second space S2 larger than the first space S1 exists between the third rail 22 (or the object 10) and the obstacle 66. Simply put, by keeping the second rail 20 at the first extended position P1 relative to the first rail 18, a relatively ample space can be formed to facilitate removal of the object 10 (e.g., a chassis) or maintenance of the slide rail assembly 12.

Figure 9:
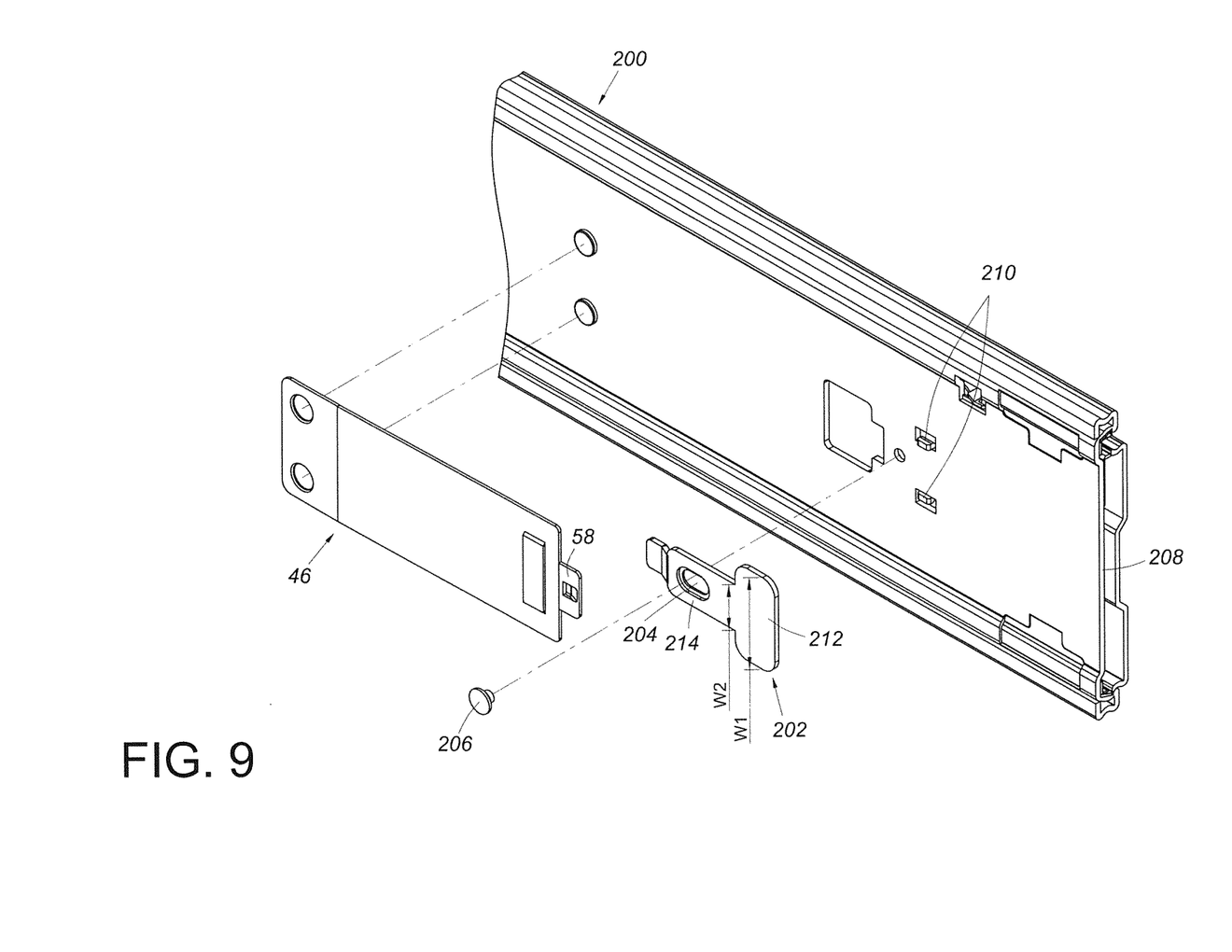
FIG. 9 is a partial exploded perspective view of the slide rail assembly in another embodiment of the present invention, wherein the engaging member and the operation member are provided on the second rail.

FIG. 9 shows the slide rail assembly in another embodiment of the present invention. This embodiment is different from the previous embodiment generally in that at least one of the second rail 200 and the operation member 202 further includes a longitudinal groove 204. Here, the operation member 202 is shown as including the longitudinal groove 204 by way of example only. The operation member 202 is connected to the sidewall 208 of the second rail 200 via a connecting member 206, which has one portion extending through the longitudinal groove 204 and another portion blocked at the opposite side of the operation member 202, and the connection is such that the operation member 202 can be operated and hence displaced relative to the second rail 200. Preferably, the sidewall 208 of the second rail 200 further has a pair of transverse portions 210 corresponding respectively to the upper and lower sides of the operation member 202 in order to keep the operation member 202 in place. Moreover, the operation member 202 may further include a head 212 and a body 214 connected to the head 212. The width W1 of the head 212 is greater than the width W2 of the body 214, the longitudinal groove 204 can be located at the body 214, and the body 214 is located between the pair of transverse portions 210 and has a portion corresponding to the abutment portion 58 of the engaging member 46.

Figure 10:
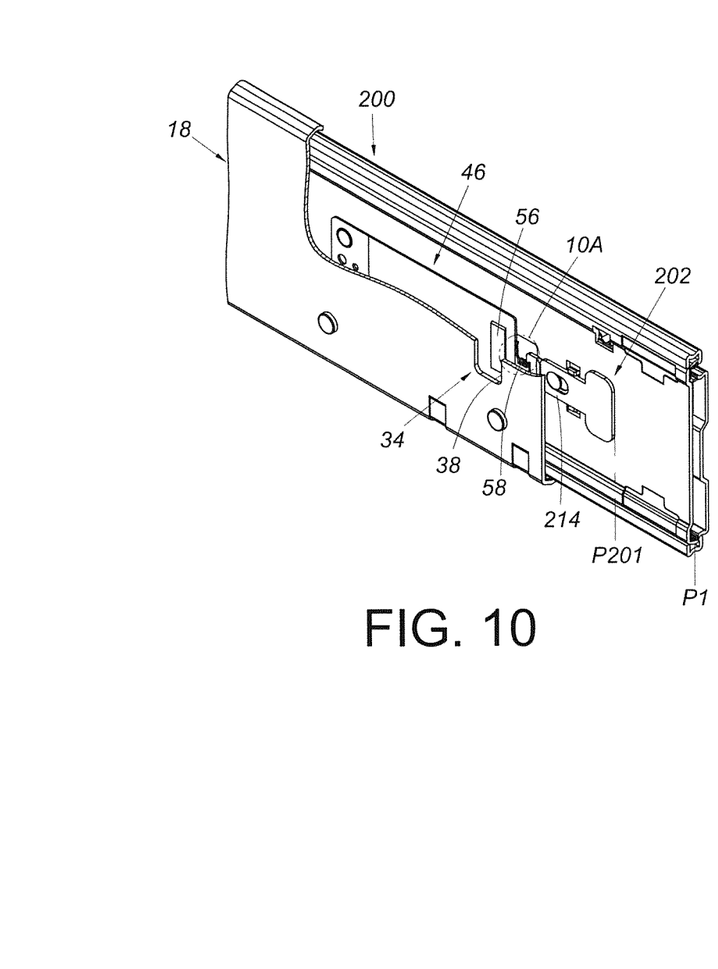
FIG. 10 is a perspective view showing the second rail of the slide rail assembly in FIG. 9 at a first extended position relative to the first rail, wherein the engaging portion of the engaging member has yet to be blocked by the blocking feature of the first rail.
Figure 10A:
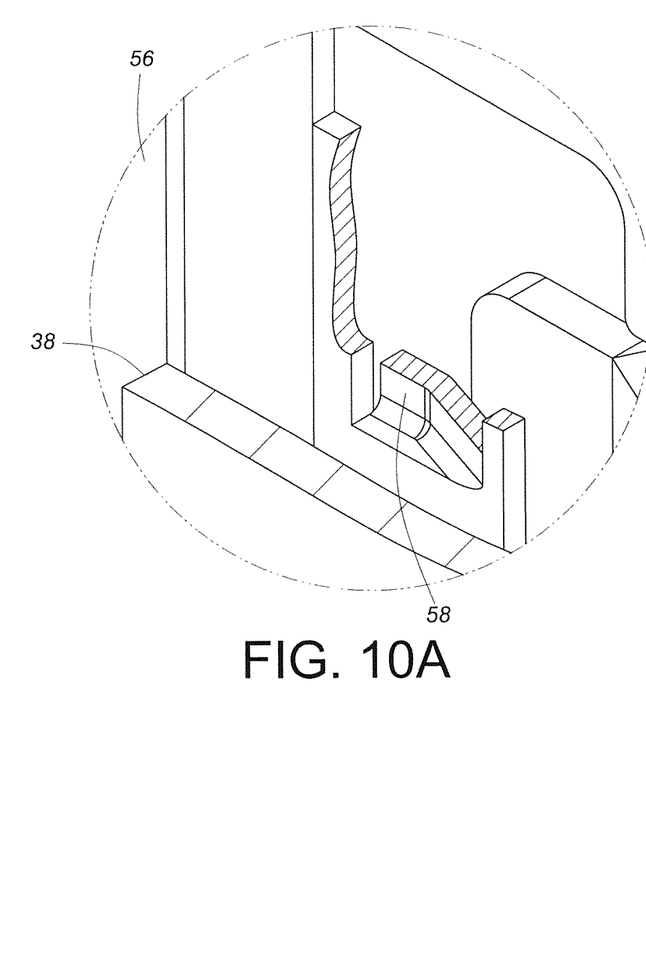
FIG. 10A is an enlarged view of the circled area 10A in FIG. 10, showing that the engaging portion of the engaging member has yet to be blocked by the blocking wall of the first rail.

Referring to FIG. 10 and FIG. 10A, once the second rail 200 is displaced relative to the first rail 18 to the first extended position P1, the engaging member 46 is in the initial state and is not blocked by the blocking feature 34 of the first rail 18. More specifically, the engaging portion 56 of the engaging member 46 is not blocked by the at least one blocking wall 38 of the first rail 18. On the other hand, the operation member 202 is at a first position P201, at which a portion of the body 214 of the operation member 202 is adjacent to the abutment portion 58 of the engaging member 46 while the abutment portion 58 corresponds to that portion of the operation member 202.

Figure 11:
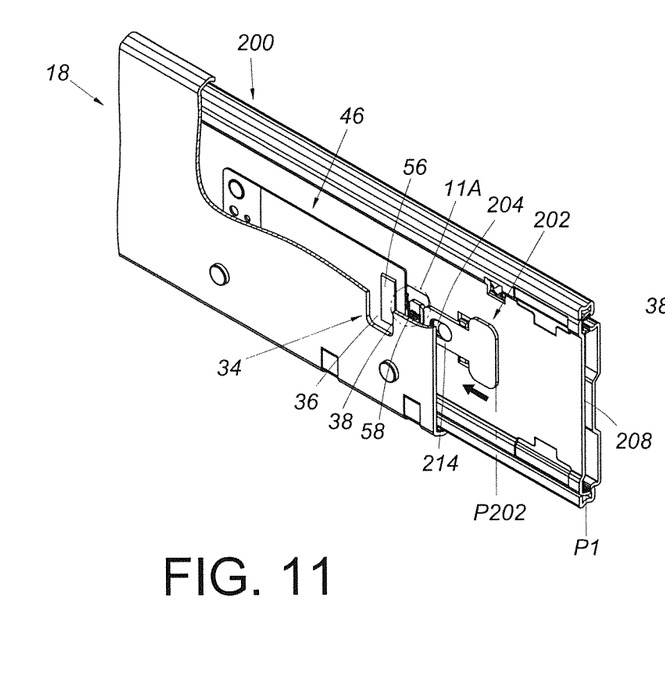
FIG. 11 is a perspective view showing how the operation member of the slide rail assembly in FIG. 9 is operated and thus longitudinally displaced to a certain position where the engaging portion of the engaging member is blocked by the blocking feature of the first rail.
Figure 11A:
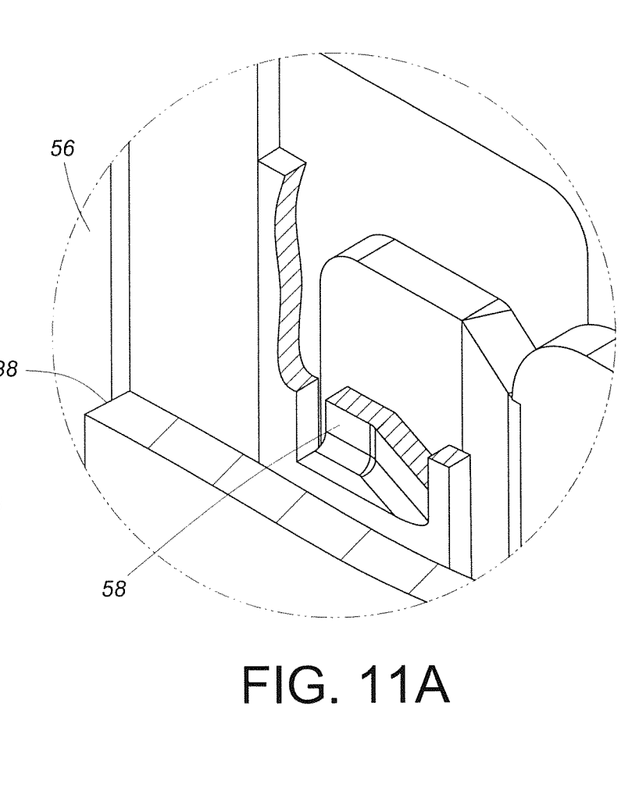
FIG. 11A is an enlarged view of the circled area 11A in FIG. 11, showing how the engaging portion of the engaging member is blocked by the blocking wall of the first rail.

Referring to FIG. 11 and FIG. 11A, an operator can operate the operation member 202 manually so that the operation member 202 is longitudinally displaced along the length of the longitudinal groove 204 from the first position P201 to a second position P202 relative to the sidewall 208 of the second rail 200. As a result, the body 214 pushes the abutment portion 58 of the engaging member 46 and thereby drives the engaging portion 56 of the engaging member 46 into the opening 36 of the blocking feature 34 of the first rail 18. Once the engaging portion 56 of the engaging member 46 is blocked by the at least one blocking wall 38, the second rail 200 is kept at the first extended position P1 relative to the first rail 18. It is worth mentioning that the operator can also displace the operation member 202 from the second position P202 back to the first position P201 to release the engaging portion 56 of the engaging member 46 from the at least one blocking wall 38.

While the present invention has been disclosed through the foregoing preferred embodiments, the embodiments are not intended to be restrictive of the present invention. The scope of patent protection sought by the applicant is defined solely by the appended claims.

The invention claimed is:

1. A slide rail assembly, comprising:
a first rail including a blocking feature;
a second rail movably connected to the first rail and longitudinally displaceable relative to the first rail from a retracted position to a first extended position and a second extended position, the first extended position being disposed intermediately between the retracted and second extended positions;
an engaging member attached to the second rail, the engaging member having an engaging portion displaceable between locking and releasing positions, the engaging portion in the locking position locking the first and second rails against displacement relative to one another; and
an operation member mounted to the second rail, the operation member being displaceable to selectively block the engaging portion to remain in the locking position and thus retain the second rail at the first extended position.

2. The slide rail assembly of claim 1, wherein the first rail has a front portion, and a blocking feature adjacent to the front portion of the first rail.

3. The slide rail assembly of claim 1, wherein the first rail further includes an upper wall, a lower wall, and a sidewall connected between the upper wall and the lower wall; the sidewall has a blocking feature; the blocking feature includes an opening; and the opening has a periphery provided with at least one blocking wall.

4. The slide rail assembly of claim 1, wherein the second rail includes an upper wall, a lower wall, and a sidewall connected between the upper wall and the lower wall; and the engaging member is attached to the sidewall of the second rail.

5. The slide rail assembly of claim 1, wherein the engaging member includes an abutment portion, and the operation member is movably mounted to the second rail and is configured to push the abutment portion so that the engaging portion of the engaging member is blocked by the blocking feature of the first rail.

6. The slide rail assembly of claim 5, further comprising a connecting member for movably connecting the operation member to the second rail.

7. The slide rail assembly of claim 1, wherein the engaging member includes an abutment portion extending from the engaging portion, and a connecting member passed through a longitudinal opening formed in the operation member to the second rail, the operation member being slidable about the connecting member to be displaced relative to the second rail and thereby push the abutment portion so that the engaging portion of the engaging member is blocked by a blocking feature formed on the first rail.

8. The slide rail assembly of claim 1, further comprising a third rail longitudinally movably connected to the second rail.

9. A slide rail assembly, comprising:
a first rail including a blocking feature;
a second rail longitudinally movably connected to the first rail and displaceable relative to the first rail from a retracted position to a first extended position and a second extended position, the first extended position being disposed intermediately between the retracted and second extended positions;
an engaging member attached to the second rail, the engaging member having an engaging portion displaceable between locking and releasing positions, the engaging portion in the locking position locking the first and second rails against displacement relative to one another; and
an operation member mounted to the second rail and displaceable to selectively block the engaging portion to remain in the locking position;

wherein when the second rail is displaced relative to the first rail to the first extended position, the operation member is manually displaceable to block the engaging member and thus retain the second rail at the first extended position relative to the first rail.

10. A slide rail assembly adapted for mounting an object to a rack, the rack comprising a first post and a second post, the slide rail assembly comprising:

a first rail having two portions respectively connected with a first bracket and a second bracket, wherein the first bracket and the second bracket are mounted to the first post and the second post respectively, and the first rail including a blocking feature;

a second rail longitudinally movably connected to the first rail and displaceable relative to the first rail from a retracted position to a first extended position and a second extended position, the first extended position being disposed intermediately between the retracted and second extended positions;

a third rail longitudinally movably connected to the second rail and mounted with the object;

an engaging member attached to the second rail, the engaging member having an engaging portion displaceable between locking and releasing positions, the engaging portion in the locking position locking the first and second rails against displacement relative to one another; and an operation member mounted to the second rail and displaceable to selectively block the engaging portion to remain in the locking position, the engaging member thereby engaging the blocking feature of the first rail retaining the second rail at the first extended position.

* * * * *